United States Patent
Kudo et al.

(10) Patent No.: US 7,098,267 B2
(45) Date of Patent: Aug. 29, 2006

(54) POLYAMIC ACID VARNISH COMPOSITION AND A FLEXIBLE PRINTED BOARD

(75) Inventors: Noriaki Kudo, Kanuma (JP); Minoru Nagashima, Kanuma (JP)

(73) Assignee: Sony Chemicals Corp., Tokyo (JP)

( * ) Notice: Subject to any disclaimer, the term of this patent is extended or adjusted under 35 U.S.C. 154(b) by 0 days.

(21) Appl. No.: 10/929,416

(22) Filed: Aug. 31, 2004

(65) Prior Publication Data

US 2005/0027099 A1 Feb. 3, 2005

Related U.S. Application Data

(62) Division of application No. 09/730,823, filed on Dec. 7, 2000, now Pat. No. 6,805,967.

(30) Foreign Application Priority Data

Dec. 17, 1999 (JP) ................................. 11-360041

(51) Int. Cl.
*C08L 77/00* (2006.01)

(52) U.S. Cl. ...................................... 524/538; 525/436

(58) Field of Classification Search ................ 528/170, 528/353; 525/432, 436; 524/538
See application file for complete search history.

(56) References Cited

U.S. PATENT DOCUMENTS

| 4,496,715 | A | 1/1985 | Sattler |
| 5,418,066 | A | 5/1995 | Chen et al. |
| 5,494,991 | A | 2/1996 | Kaneko et al. |
| 6,346,598 | B1 | 2/2002 | Hashimoto et al. |
| 6,355,357 | B1 * | 3/2002 | Takahashi et al. ....... 428/473.5 |

FOREIGN PATENT DOCUMENTS

| EP | 0-659-553 | 6/1995 |
| EP | 1-014-765 | 6/2000 |
| EP | 1 014 765 A2 * | 6/2000 |
| JP | 63-8414 | 1/1988 |
| JP | 5-214291 | 8/1993 |
| JP | 9-194725 | 7/1997 |

* cited by examiner

*Primary Examiner*—Ana Woodward
(74) *Attorney, Agent, or Firm*—Oliff & Berridge, PLC

(57) ABSTRACT

A polyamic acid varnish composition, which is composed of a polyamic acid obtained by the addition polymerization of an diamine and an aromatic acid dianhydride, contains as an additive a specific imidazolyl-diaminoazine.

3 Claims, No Drawings

POLYAMIC ACID VARNISH COMPOSITION AND A FLEXIBLE PRINTED BOARD

This is a Division of application Ser. No. 09/730,823 filed Dec. 7, 2000 now U.S. Pat. No. 6,805,967. The entire disclosure of the prior application is hereby incorporated by reference herein in its entirety.

BACKGROUND OF THE INVENTION

1. Field of the Invention

The present invention relates to a polyamic acid varnish composition which is intended to form a polyimide insulating layer of a flexible printed board, and a flexible printed board which employs same.

2. Description of the Related Art

Flexible printed boards in which polyimide insulating layers formed directly onto a metal foil, e.g., copper foil, without an adhesive being interposed therebetween are manufactured by applying a polyamic acid varnish composition, which is obtained through the addition polymerization of an aromatic diamine such as a paraphenylenediamine and an aromatic acid dianhydride such as pyromellitic dianhydride in a solvent such as N-methyl-2-pyrrolidone, onto the copper foil, drying the whole to obtain a polyamic acid layer (polyimide precursor layer), and then heating and imidizing it at 300–400° C. to form a polyimide insulating layer.

However, the presence of carboxyl groups in the polyamic acid gives rise to such problems as the corrosion and discoloration of the copper foil surface when the polyamic acid varnish is applied to the copper foil as described in the foregoing, as well as the formation of copper ions which bring about electrical migration in the flexible printed wiring board.

Accordingly, an imidazole-based rust inhibitor (e.g., Adekastub CDA-1; manufactured by Asahi Denka) is generally added to polyamic acid varnishes which are used upon manufacture of flexible printed boards.

However, conventionally used rust inhibitors dissolve poorly in the polyamic acid varnish, and furthermore, excessive blooming occurs on the polyimide surface under the high temperature heating during imidation, resulting in a deterioration in the adhesive strength of the polyimide with respect to the copper foil. Moreover, the rust-inhibitor is scattered during imidation, forming a vapor residue substance that deposits on the imidation process apparatus and on the flexible printed board products and contaminates them.

SUMMARY OF THE INVENTION

In an attempt to resolve the aforedescribed problems in the prior art, it is an object of the present invention to provide a polyamic acid varnish composition which is free of problems such as blooming or vapor residue substance formation occurring during the polyamic acid imidation, and electrical migration, and furthermore, from which it is possible to form a polyimide insulating layer which demonstrates satisfactory adhesive strength with respect to copper foil.

The present inventors perfected the present invention based on the discovery that a polyamic acid varnish composition, which is obtained by adding a specific imidazolyl-diaminoazine into a mixture which contains a polyamic acid obtained by the addition polymerization of an aromatic diamine and an aromatic acid dianhydride in a solvent, can achieve the aforesaid objective.

In other words, the present invention provides a polyamic acid varnish composition, comprising a polyamic acid obtained by the addition polymerization of an aromatic diamine and an aromatic acid dianhydride, and a solvent, wherein said polyamic acid varnish composition contains as an additive an imidazolyl-diaminoazine as represented by the Formula (1)

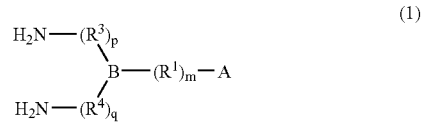

(In the formula, A is an imidazolyl group as represented by Formulae (1a), (1b) or (1c).

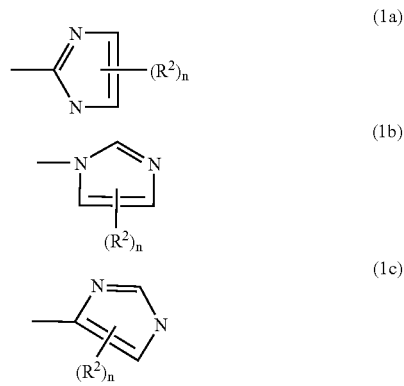

$R^1$ is an alkylene group, and m is 0 or 1. $R^2$ is an alkyl group and n is 0, 1, or 2. $R^3$ and $R^4$ are alkylene groups, and p and q are respectively 0 or 1. B is an azine, diazine or triazine residue.).

Moreover, the present invention provides a flexible printed board having a polyimide insulating layer furnished on a metal foil, wherein the polyimide insulating layer is formed by forming a film of the aforementioned polyamic acid varnish composition on the metal foil, followed by imidizing.

DETAILED DESCRIPTION OF THE INVENTION

The polyamic acid varnish composition pertaining to the present invention has in common with conventional polyamic acid varnish compositions the aspect that it is constituted from a polyamic acid obtained by the addition polymerization of an aromatic diamine and an aromatic acid dianhydride, and a solvent. However, the polyamic acid varnish composition pertaining to the present invention is characterised by the aspect that it contains as an additive an imidazolyl-diaminoazine represented by Formula (1), in whose molecules is contained an imidazole residue which has a rust-inhibiting effect. Accordingly, the polyamic acid varnish composition pertaining to the present invention exhibits no problems such as blooming or vapor residue substance formation during the imidation of the polyamic acid, nor electrical migration, and therefrom a polyimide insulating layer can be formed which exhibits satisfactory adhesive strength with respect to copper foil. The exact reasons for this are not clear, but it is presumably due to the imidazolyl-diaminoazine, which is represented in Formula (1) and compounded as an additive, being taken into the polyimide created from the reaction with the polyamic acid during imidation.

In the imidazolyl-diaminoazine as represented by Formula (1), when m is 0, there are no alkylene groups $R^1$ and the imidazole ring and the azine, diazine or triazine residue are directly bonded. Methylene, ethylene, propylene or the like can be cited as the alkylene groups $R^1$ when m is 1.

When n is 0, there are no alkyl groups $R^2$ and a hydrogen atom is bonded to the imidazole ring. Methyl, ethyl or the like can be cited as the alkyl groups $R^2$ when n is 1. When n is 2, two $R^2$ groups are bonded to the imidazole ring, and methyl, ethyl or the like may be independently cited as examples of each type of alkyl group $R^2$. $R^2$ may occasionally be directly bonded to a nitrogen atom of the imidazole ring.

When p is 0, there are no alkylene groups $R^3$ and the amino group is directly bonded to the azine, diazine or triazine residue. Methylene, ethylene or the like can be cited as examples of the alkylene groups $R^3$ when p is 1.

When q is 0, there are no alkylene groups $R^4$ and the amino group is directly bonded to the azine, diazine or triazine residue. Methylene, ethylene or the like can be cited as examples of the alkylene groups $R^4$ when q is 1.

B represents an azine, diazine or triazine residue. Among these, a diamine which contains a triazine residue is preferable because of ease of synthesis and commercial availability.

The following compounds can be cited as specific examples of preferable imidazolyl-diaminoazines as represented by Formula (1), when p and q are both 0.

2,4-diamino-6-[2-(2-methyl-1-imidazolyl)ethyl]-s-triazine;
2,4-diamino-6-[2-(2-ethyl-1-imidazolyl)ethyl]-s-triazine;
2,4-diamino-6-[1-(2-undecyl-1-imidazolyl)ethyl]-s-triazine;
2,4-diamino-6-[2-(2-imidazolyl)ethyl]-s-triazine;
2,4-diamino-6-[2-(1-imidazolyl)ethyl]-s-triazine;
2,4-diamino-6-(2-ethyl-4-imidazolyl)-s-triazine;
2,4-diamino-6-[2-(4-methyl-1-imidazolyl)ethyl]-s-triazine;
2,4-diamino-6-(2-ethyl-5-methyl-4-imidazolyl)-s-triazine;
2,4-diamino-6-(4-ethyl-2-methyl-1-imidazolyl)-s-triazine;
2,4-diamino-6-[3-(2-methyl-1-imidazolyl)propyl]-s-triazine;
2,4-diamino-6-[4-(2-imidazolyl)butyl]-s-triazine;
2,4-diamino-6-[2-(2-methyl-1-imidazolyl)propyl]-s-triazine;
2,4-diamino-6-[1-methyl-2-(2-methyl-1-imidazolyl)ethyl]-s-triazine;
2,4-diamino-6-[2-(2,5-dimethyl-1-imidazolyl)ethyl]-s-triazine;
2,4-diamino-6-[2-(2,4-dimethyl-1-imidazolyl)ethyl]-s-triazine; or
2,4-diamino-6-[2-(2-ethyl-4-methyl-1-imidazolyl)ethyl]-s-triazine.

Of these, the following are considered as preferable:
2,4-diamino-6-[2-(2-ethyl-4-methyl-1-imidazolyl)ethyl]-s-triazine;
2,4-diamino-6-[2-(2-methyl-1-imidazolyl)ethyl]-s-triazine; and
2,4-diamino-6-[1-(2-undecyl-1-imidazolyl)ethyl]-s-triazine.

The imidazolyl-diaminoazine represented by Formula (1) compounded in the polyamic acid varnish composition will result in the polyimide insulating layer exhibiting insufficient adhesive strength when present in excess or insufficient amounts, and moreover, the mechanical strength and heat resistance will decrease in the event of an excess amount. Therefore, it is preferable for the content to be 0.1 to 10 wt parts, and more preferably 0.1 to 5 wt parts, per 100 wt parts polyamic acid, which constitutes the solid component.

According to the present invention, any known conventional aromatic diamine can be preferably cited for use as the aromatic diamine component of the polymeric acid. For instance, 4,4'-diaminodiphenylether, paraphenylenediamine, 4,4'-diaminobenzanilide, 4,4'-bis(p-aminophenoxy)diphenylsulfone and 2,2-bis[4-(4-aminophenoxy)phenyl]propane can be cited as preferred examples.

Of the aforesaid aromatic diamines, paraphenylenediamine is preferably used in order to reduce the thermal expansion properties of the polyimide. 4,4'-diaminodiphenyl ether is preferably used in order to increase the thermal expansion properties of the polyimide.

Any known aromatic acid dianhydride can be preferably cited for use as the aromatic acid dianhydride component of the polyamic acid. For instance, pyromellitic dianhydride (PMDA), 3,4,3',4'-biphenyltetracarboxylic dianhydride (BPDA), 3,4,3',4'-benzophenonetetracarboxylic dianhydride (BTDA), or 3,4,3',4'-diphenylsulfonetetracarboxylic dianhydride (DSDA) can be cited as preferred examples.

The ratio of aromatic diamine, which constitutes the polyamic acid, used with respect to the aromatic acid dianhydride is not affected by whether there is an excess of aromatic diamines or aromatic acid dianhydrides, though it is preferable for them to be used in an equimolar ratio.

Any solvent which is used in conventional known polyamic acid varnish compositions may be used as the solvent in the polyamic acid varnish composition pertaining to the present invention; N-methyl-2-pyrrolidone being a preferred example.

There is no particular restriction on the amount of solvent to be used. It can be suitably determined in accordance with the viscosity etc. of the polyamic acid varnish composition.

Any known conventional additive may be compounded with the polyamic acid varnish composition pertaining to the present invention, according to need.

The polyamic acid varnish composition pertaining to the present invention is obtained by the addition polymerization of an aromatic diamine and an aromatic acid dianhydride in a solvent. The addition polymerization conditions can be suitably determined in accordance with polyamic acid addition polymerization conditions as used when conventionally performed. Specifically, first, an aromatic diamine is heated and dissolved in a solvent (e.g., N-methyl-2-pyrrolidone), and addition polymerization is conducted over several hours while an, acid dianhydride is gradually added in an atmosphere of inert gas such as nitrogen at 0–90° C. and preferably 5–50° C. Polyamic acid dissolved in the solvent is thus obtained. The polyamic acid varnish composition pertaining to the present invention can be obtained by adding, mixing and dissolving an imidazolyl-diaminoazine, as represented by Formula (1), into the solution.

A substrate with a structure whereby a polyimide insulating layer has been furnished on a metal foil can be cited for use as the flexible printed board obtained when using the polyamic acid varnish composition pertaining to the present invention.

The polyimide insulating layer is formed by forming the polyamic acid varnish composition pertaining to the present invention as a film and subjecting it to imidation. Setting the coefficient of thermal expansion of the polyimide used in the present invention at or slightly above the coefficient of thermal expansion of the metal foil used is preferable in terms of preventing the flexible printed board (and a wiring board fabricated therefrom) from undergoing excessive curling (or a convexity from being formed on the polyimide side due to curling). The coefficient of thermal expansion of the polyimide can be adjusted through combining diamines and acid dianhydrides, as disclosed in Japanese Patent Application Laid-Open No. 60-157286.

There is no particular restriction on the thickness of the polyimide insulating layer, with a thickness of 10–50 μm being common.

Various types of metal foil may be used for this flexible printed board. Preferred examples thereof include aluminium foil, copper foil and gold foil. These metal foils may also be appropriately matted, plated or treated with aluminium alcoholates, aluminium chelates, silane coupling agents or the like.

There is no particular restriction on the thickness of the metal foil, with a thickness of 5–35 μm being common.

The flexible printed board as described above can be manufactured as described hereinbelow.

First, the polyamic acid varnish composition pertaining to the present invention is applied to a metal foil using a comma coater, then dried thereupon, resulting in a polyamic acid layer which serves as a polyimide precursor. It is preferable for the amount of residual volatile content (content of remaining solvent undried and of water generated upon imidation) to be kept to 70% or less in the drying process so as to prevent foaming during the subsequent imidation step.

The resulting polyamic acid layer is heated in an inert atmosphere (e.g., a nitrogen atmosphere) at 300–400° C. and imidized to form an insulating layer composed of a polyimide. A flexible printed board is obtained from this process.

In flexible printed boards so obtained, neither corrosion nor discoloration will occur on the surface of the copper or other metal foil (polyimide formation surface). Moreover, no electrical migration will be caused by copper ions when the flexible printed board is used as a wiring board. No blooming will occur on the polyimide surface from the rust inhibitor, and no formation of vapor residue substance will occur during imidation. Accordingly the adhesive strength between the polyimide layer and the copper foil will be satisfactory.

EXAMPLES

The present invention shall be described in detail below.

Examples 1 through 5 and Comparative Examples 1 through 2

83.3 g (0.77 mol) paraphenylenediamine (PDA; manufactured by Daishin Kasei) and 46.0 g (0.23 mol) 4,4'-diaminodiphenylether (DPE; manufactured by Wakayama Seika) were dissolved in approximately 3 kg of the solvent N-methyl-2-pyrrolidone (NMP; manufactured by Mitsubishi Chemical) in a 5 L jacketed reaction vessel under a nitrogen gas ambient atmosphere and the solution was maintained at 50° C. 297.1 g (1.01 mol) 3,4,3',4'-biphenyltetracarboxylic dianhydride (BPDA; manufactured by Mitsubishi Chemical) was then gradually added therein and a reaction allowed to occur for three hours.

21.3 g 2,4-diamino-6-[2-(2-ethyl-4-methyl-1-imidazolyl)ethyl-s-triazine as the imidazolyl-diaminoazine (5 wt parts to 100 wt parts polyamic acid) was added to the resulting polyamic acid solution and dissolved therein, resulting in a polyamic acid varnish.

The polyamic acid varnishes pertaining to Examples 2 through 5 and Comparative Examples 1 through 2 were obtained by repeating the same procedure of Example 1, in accordance with the compounding ratios shown in Table 1.

TABLE 1

| Acid Dianhydride | Diamine (a) | (b) | Molar ratio (a)/(b) | Weight parts of Formula (1) compd. |
|---|---|---|---|---|
| Example | | | | |
| 1 | BPDA | PDA | DPE | 75/25 | 5 |
| 2 | BPDA | PDA | DPE | 75/25 | 2 |
| 3 | BPDA | PDA | DPE | 75/25 | 10 |
| 4 | BPDA | PDA | DPE | 75/25 | 3 |
| 5 | PMDA | PDA | DABA | 30/70 | 5 |
| Comparative Example | | | | |
| 1 | BPDA | PDA | DPE | 75/25 | — |
| 2 | PMDA | PDA | DABA | 30/70 | — |

The compounds mentioned in Table 1 are as follows: (aromatic acid dianhydrides)
BPDA: 3,4,3',4'-biphenyltetracarboxylic dianhydride
PMDA: pyromellitic dianhydride (aromatic diamines)
PDA: paraphenylenediamine
4,4'-diaminodiphenyletherDABA: 4,4'-diaminobenzanilide Next, the polyamic acid varnishes pertaining to Examples 1 through 5 and Comparative Examples 1 through 2 were applied onto copper foils (SQ-VLP 12 μm electrolytic foils; Mitsui Kinzoku) which had been soft-etched with 2% HCl and dried, resulting in a polyamic acid layers 10 μm in thickness. The resulting laminates were placed in an atmosphere of 40° C. and 90% RH, and visually assessed as to whether the surfaces of the copper foils had suffered any discoloration. The results are shown in table 2.

Next, the same polyamic varnishes were applied onto surface-roughened copper foils (manufactured by Furukawa Circuit Foil (KK)) and dried step by step so as to prevent foaming, whereupon flexible printed boards which had a 25 μm-thick polyimide insulating layer were obtained by imidizing the laminates in a nitrogen atmosphere at 350° C. (10 min).

The copper foil of the resulting flexible printed boards was patterned to form parallel circuits with a conductor interval of 0.1 mm, yielding wiring boards. The wiring boards were allowed to stand for 7 days in an 85° C./90% RH atmosphere while a DC voltage of 50V was applied between adjacent conductor patterns. Thereafter, the resistance between the adjacent conductor patterns was measured, and electrical migration was also measured. A resistance of $10^7$ Ω or higher was considered acceptable.

The peel strength (kg/cm) of the polyimide insulating layers of the flexible printed boards was also measured as adhesive strength at 23° C. according to JIS C 6471 (peeling in a 90° direction at a width of 1.59 mm). The results are shown in Table 2.

TABLE 2

| Rust preventing effects (discoloration) | Electrical migration | Adhesive strength (23° C.)(kg/cm) |
|---|---|---|
| Examples | | |
| 1 | none | pass | 1.43 |
| 2 | none | pass | 1.46 |
| 3 | none | pass | 1.50 |

TABLE 2-continued

| | Rust preventing effects (discoloration) | Electrical migration | Adhesive strength (23° C.)(kg/cm) |
|---|---|---|---|
| 4 | none | pass | 1.35 |
| 5 | none | pass | 1.36 |
| Comparative Examples | | | |
| 1 | rapid discoloration | fail (shorting) | 0.74 |
| 2 | rapid discoloration | fail (shorting) | 0.63 |

As can be understood from the results in Table 2, the flexible printed boards (Examples 1 through 5), which contained polyimide insulating layers formed from polyamic acid varnishes which contained a specific imidazolyl-diaminoazine as a separate additive, exhibited an excellent rust preventing effect even though a rust-inhibitor was not used. Moreover, the data show that no electrical migration occurred, and that the adhesive strength between the polyimide insulating layer and the copper foil was satisfactory.

Conversely, the flexible printed boards (Comparative Examples 1 through 2), which contained polyimide insulating layers formed from polyamic acid varnishes which did not contain a specific imidazolyl-diaminoazine as a separate additive, exhibited no rust inhibiting effect, exhibited electrical migration and had inadequate adhesive strength between the polyimide insulating layer and the copper foil.

According to the polyamic acid varnish composition pertaining to the present invention, a specific imidazolyl-diaminoazine is contained as an additive, and hence no problems such as blooming or the formation of vapor residue substances occur during the imidation of polyamic acid, nor any electrical migration, and furthermore, it is possible to form a polyimide insulating layer which demonstrates satisfactory adhesive strength with respect to the copper foil.

The entire disclosure of the specification and claims of Japanese Patent Application No. 11-360041 filed on Dec. 17, 1999 is hereby incorporated by reference.

What is claimed is:

1. A polyamic acid varnish composition, comprising:
a polyamic acid obtained by addition polymerization of an aromatic diamine and an aromatic acid dianhydride; and
a solvent;
wherein:
the polyamic acid varnish composition comprises an imidazolyl-diaminoazine as an additive;
the imidazolyl-diaminoazine is present in the polyamic acid varnish composition in an amount of from 0.1 to 10 wt parts per 100 wt parts of the polyamic acid; and
the imidazolyl-diaminoazine is selected from the group consisting of:
2,4-diamino-6-[1-(2-undecyl-1-imidazolyl)ethyl]-s-triazine;
2,4-diamino-6-[2-(2-imidazolyl)ethyl]-s triazine;
2,4-diamino-6-[2-(1-imidazolyl)ethyl]-s-triazine;
2,4-diamino-6-(2-ethyl-4-imidazolyl)-s-triazine;
2,4-diamino-6-[2-(4-methyl-1-imidazolyl)ethyl]-s-triazine;
2,4-diamino-6-(2-ethyl-5-methyl-4-imidazolyl)-s-triazine;
2,4-diamino-6-(4-ethyl-2-methyl-1-imidazolyl)-s-triazine;
2,4-diamino-6-[3-(2-methyl-1-imidazolyl)propyl]-s-triazine;
2,4-diamino-6-[4-(2-imidazolyl)butyl]-s-triazine;
2,4-diamino-6-[2-(2-methyl-1-imidazolyl)propyl]-s-triazine;
2,4-diamino-6-[1-methyl-2-(2-methyl-1-imidazolyl)ethyl]-s-triazine;
2,4-diamino-6-[2-(2,5-dimethyl-1-imidazolyl)ethyl]-s-triazine; and
2,4-diamino-6-[2-(2,4-dimethyl-1-imidazolyl)ethyl]-s-triazine.

2. The polyamic acid varnish composition according to claim 1, wherein the aromatic diamine is selected from the group consisting of 4,4'-diaminodiphenylether, paraphenylenediamine, 4,4'-diaminobenzanilide, 4,4'-bis(p-aminophenoxy)diphenylsulfone and 2,2-bis[4-(4-aminophenoxy)phenyl] propane.

3. The polyamic acid varnish composition according to claim 1, wherein the aromatic acid dianhydride is selected from the group consisting of pyromellitic dianhydride, 3,4,3',4'-biphenyltetracarboxylic dianhydride, 3,4,3',4'-benzophenonetetracarboxylic dianhydride, and 3,4,3',4'-diphenylsulfonetetracarboxylic dianhydride.

* * * * *